United States Patent
Liu

(10) Patent No.: US 9,222,969 B2
(45) Date of Patent: Dec. 29, 2015

(54) SELF-ISOLATING MIXED DESIGN-RULE INTEGRATED YIELD MONITOR

(75) Inventor: Jin Liu, Southlake, TX (US)

(73) Assignee: TEXAS INSTRUMENTS INCOPORATED, Dallas, TX (US)

(*) Notice: Subject to any disclaimer, the term of this patent is extended or adjusted under 35 U.S.C. 154(b) by 647 days.

(21) Appl. No.: 13/602,741

(22) Filed: Sep. 4, 2012

(65) Prior Publication Data

US 2012/0326739 A1   Dec. 27, 2012

Related U.S. Application Data

(62) Division of application No. 12/340,155, filed on Dec. 19, 2008, now Pat. No. 8,258,806.

(60) Provisional application No. 61/016,534, filed on Dec. 24, 2007.

(51) Int. Cl.
*G01R 31/26* (2014.01)
*G01R 31/28* (2006.01)
*G01R 31/02* (2006.01)

(52) U.S. Cl.
CPC .......... *G01R 31/2884* (2013.01); *G01R 31/024* (2013.01)

(58) Field of Classification Search
None
See application file for complete search history.

(56) References Cited

U.S. PATENT DOCUMENTS

| | | | |
|---|---|---|---|
| 3,762,037 A | 10/1973 | Baker et al. | |
| 3,922,707 A | 11/1975 | Freed et al. | |
| 4,347,479 A | 8/1982 | Cullet | |
| 6,268,717 B1 * | 7/2001 | Jarvis et al. | 324/750.02 |
| 6,393,714 B1 * | 5/2002 | Look | G03F 7/70633 324/691 |
| 6,426,516 B1 | 7/2002 | Sloman | |
| 6,633,174 B1 | 10/2003 | Satya et al. | |
| 7,217,579 B2 | 5/2007 | Ben-Porath et al. | |

FOREIGN PATENT DOCUMENTS

GB        796413 A  *  6/1958  ............... G01V 3/12

* cited by examiner

*Primary Examiner* — Paresh Patel
(74) *Attorney, Agent, or Firm* — Jacqueline J. Garner; Frank D. Cimino

(57) ABSTRACT

Assessing open circuit and short circuit defect levels in circuits implemented in state of the art ICs is difficult when using conventional test circuits, which are designed to assess continuity and isolation performance of simple structures based on individual design rules. Including circuit blocks from ICs in test circuits provides a more accurate assessment of defect levels expected in ICs using the circuit blocks. Open circuit defect levels may be assessed using continuity chains formed by serially linking continuity paths in the circuit blocks. Short circuit defect levels may be assessed by using parallel isolation test structures formed by linking isolated conductive elements in parallel to buses. Forming isolation connections on a high metal level enables location of shorted elements using voltage contrast on partially deprocessed or partially fabricated test circuits.

10 Claims, 11 Drawing Sheets

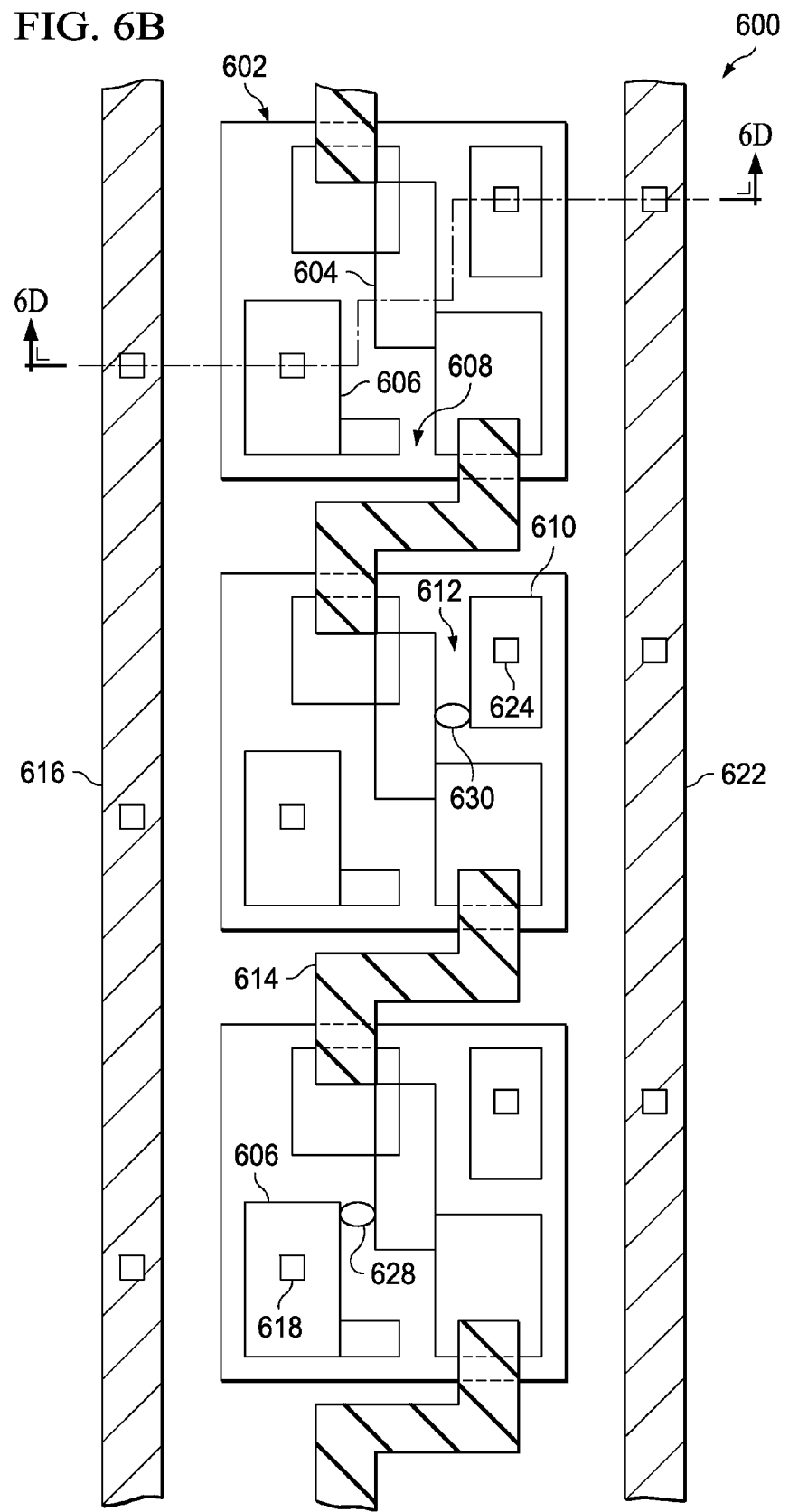

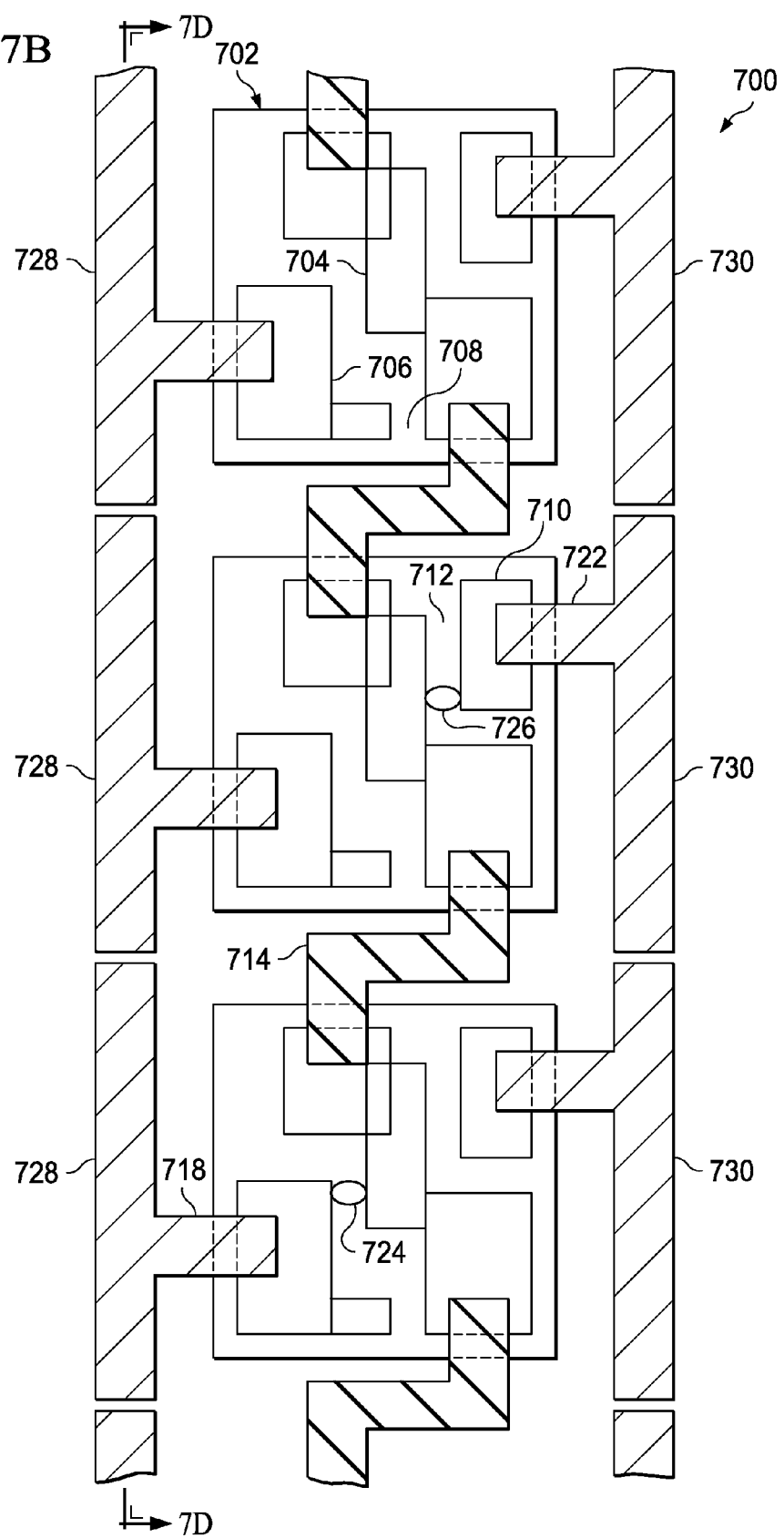

SELF-ISOLATING MIXED DESIGN-RULE INTEGRATED YIELD MONITOR

This is a division of application Ser. No. 12/340,155, filed Dec. 19, 2008 (now U.S. Pat. No. 8,258,806, which claims the benefit of Provisional Application No. 61/016,534, filed Dec. 24, 2007, the entireties of all of which are hereby incorporated by reference.

BACKGROUND

The instant invention relates to the field of integrated circuits. More particularly, the instant invention relates to test structures related to integrated circuits.

Integrated circuits (ICs) include components such as transistors, diodes, and resistors, fabricated in surface layers of semiconductor substrates. These components are connected by metal interconnects fabricated in layers above the substrates to form electronic circuits. Feature sizes of some components in state of the art ICs are less than 100 nanometers. It is common to fabricate ICs with several million transistors. Current ICs often include circuit blocks which are utilized in a plurality of IC designs.

Many ICs are designed using rules for placing and sizing interconnect features, such as width of metal lines and spaces between lines. Defects may occur during IC fabrication that cause electrical shorts between metal lines in close proximity that should be electrically isolated, or open circuits in metal lines that should be continuous. Practitioners of IC fabrication attempt to assess a level of defects for interconnects that are fabricated in a particular facility or facilities and designed using a particular set or sets of design rules. In addition, practitioners of IC fabrication attempt to identify design features that may be prone to short circuits or open circuits in high volume production. A common approach is to design a set of test circuits that reproduce various features of interest thousands or millions times in a test circuit, such that one defect among the placements of a given feature is detectable during electrical testing of the test circuits. Knowledge of defect levels for various features of interest and of features prone to short circuits or open circuits is often used by practitioners of IC fabrication to improve fabrication processes or design rules, or both.

A major shortcoming in commonly used approaches to assessing defect levels is that features in interconnect test circuits often fail to mimic features found in actual interconnects of commercial ICs. There are several phenomena behind this failure. Firstly, interconnects in commercial ICs include a multitude of configurations that defy characterization using basic structures such as line and space networks. Secondly, photolithographic processes that define interconnect patterns often generate unexpected artifacts in photoresist patterns of minimum sized features, making it difficult to design test circuits that evaluate worst case elements. Further, photolithographic processes often interact with existing interconnect levels in ICs in unpredictable ways, causing interconnect features in ICs to be formed differently than similarly designed features in test circuits which lack identical existing interconnect levels. Also, deposition and etching processes that form interconnect features are sensitive to loading effects, in that formed dimensions of an individual feature are functions not only of a photolithographic pattern of such feature, but also of average density of features in a vicinity of such feature. Loading effects of IC components are difficult to reproduce in interconnect test circuits. Lastly, designs of interconnect test circuits frequently do not provide useful information regarding physical locations of defects, which impedes efforts to isolate and analyze defect mechanisms for purposes of improving fabrication processes or design rules, or both.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention addresses the problem of assessing open circuit and short circuit defect levels in integrated circuits (ICs). A test circuit includes multiple instances of a circuit block from an IC. Continuity paths in the circuit block are connected serially by added interconnect links to form one or more continuity chains. Elements in the circuit block which are designed to be isolated from elements in the continuity chain are connected in parallel to one or more parallel isolation buses by added interconnect links. Forming the interconnect links between isolated conductive elements and the parallel isolation buses on a higher metal level than all other elements enables identification of circuit blocks with short circuit defects among the placements of all the circuit blocks by use of voltage contrast analysis on partially fabricated and partially deprocessed test circuits.

DESCRIPTION OF THE VIEWS OF THE DRAWING

FIGS. 6A and 6B are plan views of an interconnect test circuit embodying the instant invention showing high level metal connections to combs, before and after removal of the high level metal.

FIGS. 7A and 7B are plan views of an interconnect test circuit embodying the instant invention with parallel isolation bus conductors that are segmented on a lower level or levels and contiguous on a top level, before and after removal of the high level metal.

DETAILED DESCRIPTION OF EXAMPLE EMBODIMENTS

Figure 1C:
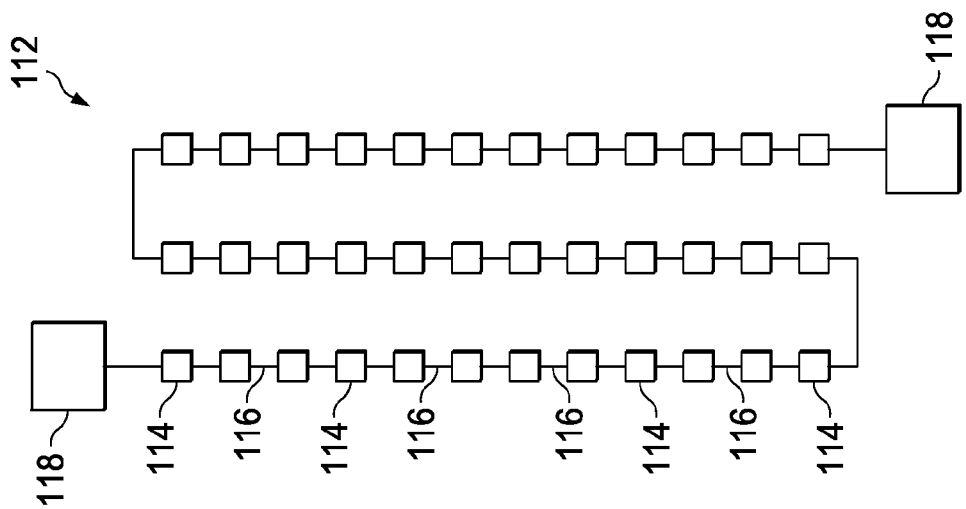
FIGS. 1A through 1C illustrate is a depiction of the process of generating a test circuit embodying the instant invention.
Figure 1B:
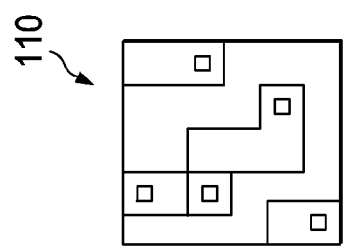
Figure 1A:
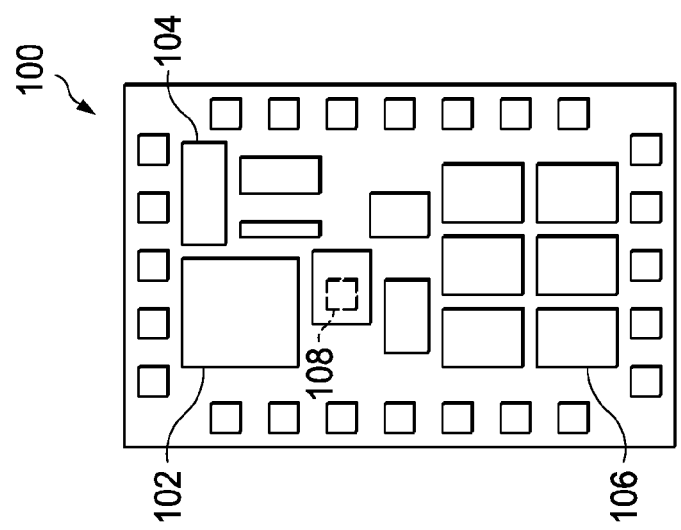

For the purposes of this invention, circuit block is defined as any contiguous subset of components and interconnects in an integrated circuit (IC). The instant invention is a test circuit which includes a set of duplicated circuit blocks from an IC. FIGS. 1A through 1C depict an IC 100 which contains several functional blocks 102, 104, 106, which may include a central processor unit, an instruction cache, and memory blocks. Circuit block 108 is a contiguous subset of components and interconnects in the IC 100. A layout of circuit block 108, which is modified to allow being linked serially, is depicted as 110. The modification may involve truncating elements which are not needed or joining elements which would otherwise be untestable. The circuit block layout 110 is duplicated multiple times in a layout for a test circuit, which is fabricated on a semiconductor substrate to form a physical test circuit 112 embodying the instant invention. Test circuit 112 includes multiple instances 114 of the circuit block, connected serially by connector elements 116 which link sequential instances of the circuit block. Connection elements 118 for testing the test circuit 112 are connected to a first instance and a last instance of the circuit block.

Figure 2:
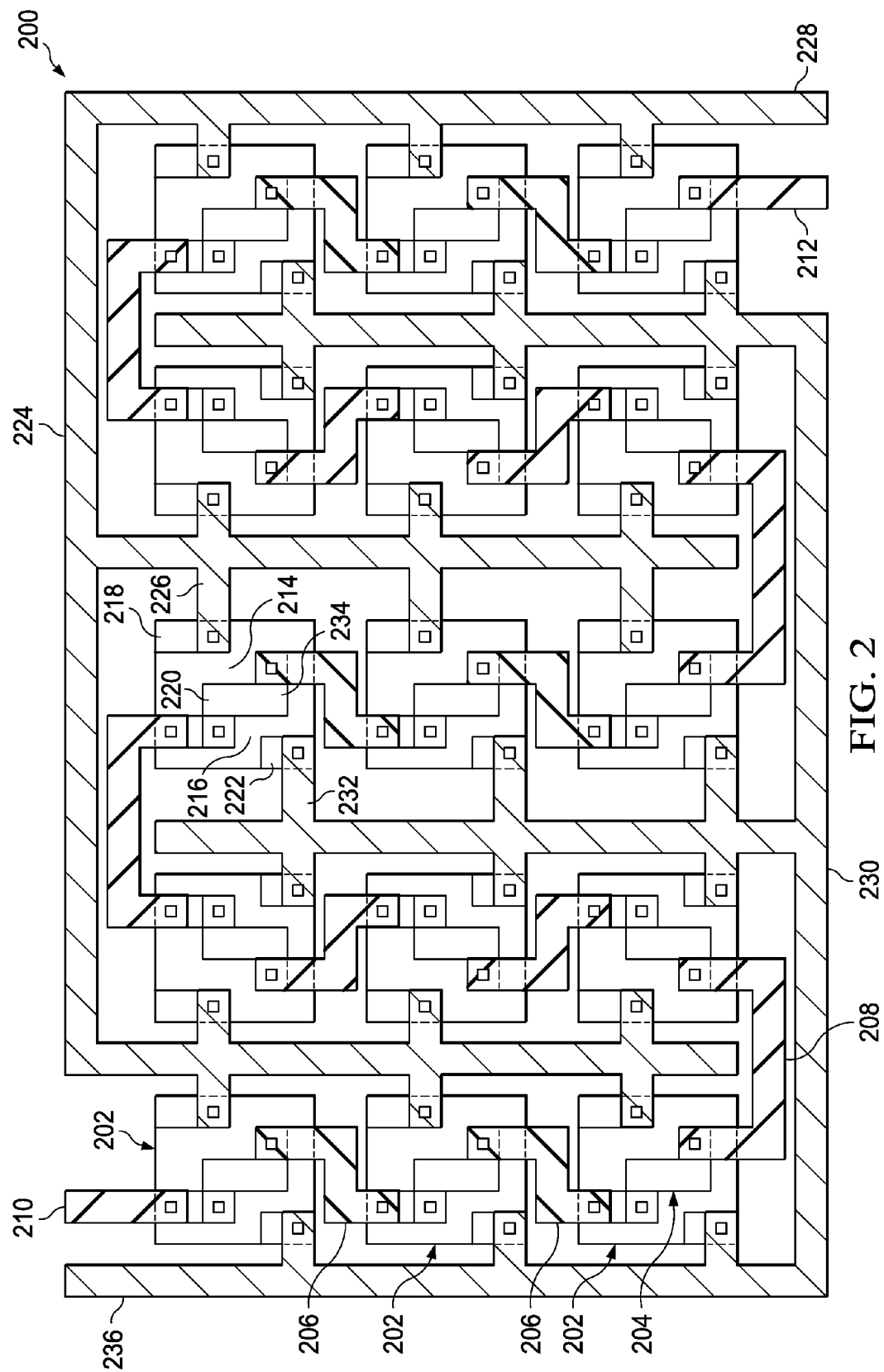
FIG. 2 is a plan view of an interconnect test circuit embodying this invention.

FIG. 2 is a plan view of an interconnect test circuit embodying the instant invention. A test circuit 200 includes circuit blocks 202. Circuit block 202 is modified to allow being linked serially and reproduced multiple times in test circuit 200 for the purpose of defect level assessment. In circuit block 202 are continuity paths 204 of conductive elements, having a first element and a last element, such that passing electrical current from the first element to the last element will result in current flowing through every element in the continuity path. One purpose of test circuit 200 is to assess a level of open circuit defects that cause open circuits in continuity paths 204. Continuity paths 204 are connected in a serial manner by continuity interconnect links 206 and serpentine interconnect links 208, which connect the last element of one instance of the continuity path 204 to the first element of a next continuity path, forming a continuity chain of individual continuity paths. In one embodiment, serpentine interconnect links 208 are in a same interconnect level as the first or last element of the continuity path, and are configured to minimize an electrical resistance of each serpentine interconnect link. It is well known to practitioners of IC fabrication that reproducing a feature of interest multiple times in a test circuit allows assessment of low levels of defect occurrence with a minimum of testing. Measuring electrical resistance from one end 210 of the continuity chain to another end 212 provides an assessment of open circuit defect levels that can be expected to occur in circuit block 202 as implemented in a commercial IC.

Still referring to FIG. 2, circuit block 202 also contains isolation features 214, 216, which separate conductors 218, 220, 222 in interconnects. Another purpose of test circuit 200 is to assess a level of defects that cause short circuits in isolation features 214, 216. Conductor 218 on one side of isolation feature 214 is electrically connected to top parallel isolation bus conductor 224 by link 226. Conductor 220 on another side of isolation feature 214 is part of, or connected to, continuity path 204. In a correctly fabricated circuit block 202, conductor 218 and conductor 220 are electrically isolated. Link 226 is reproduced to connect all instances of conductor 218 to top parallel isolation bus conductor 224. Top parallel isolation bus conductor 224 and the continuity chain are configured so as to form a parallel isolation test circuit for isolation features 214. In an embodiment, link 226 is configured to minimize any impact on formation of isolation feature 214 and conductor 218. Measuring electrical isolation from either end 210, 212 of the continuity chain to an end terminal 228 of top parallel isolation bus conductor 212 provides an assessment of short circuit defect levels that can be expected to occur in feature 214 as implemented in circuit block 202 in a commercial IC.

Still referring to FIG. 2, in a similar manner, conductors 222 adjacent to isolation features 216 are electrically connected to bottom parallel isolation bus conductor 230 by links 232 in every instance of circuit block 202, and conductors 234 also adjacent to isolation features 216, but opposite conductors 222, are part of, or connected to, continuity path 204. In a correctly fabricated circuit block 202, conductor 222 and conductor 234 are electrically isolated. Bottom parallel isolation bus conductor 230 with conductors 222 and links 232, and continuity paths 204 and links 206 are configured to form a parallel test circuit for isolation features 216. Measuring electrical isolation from either end 210, 212 of the continuity chain to an end terminal 236 of bottom parallel isolation bus conductor 230 provides an assessment of short circuit defect levels that can be expected to occur in feature 216 as implemented in circuit block 202 in a commercial IC.

It will be recognized by practitioners of IC fabrication that more than one isolation feature in a circuit block can be tested using one parallel isolation bus conductor, by connecting conductors adjacent to each isolation feature to the parallel isolation bus conductor.

Such embodiment is advantageous compared to conventional line-space interconnect test circuits because it enables a more realistic assessment of defect levels for the circuit block as implemented in a commercial IC. In view of the fact that many circuit blocks are used in a plurality of IC designs, a more realistic assessment of defect levels for such circuit block may provide significant benefits for a fabricator of ICs.

Figure 3:
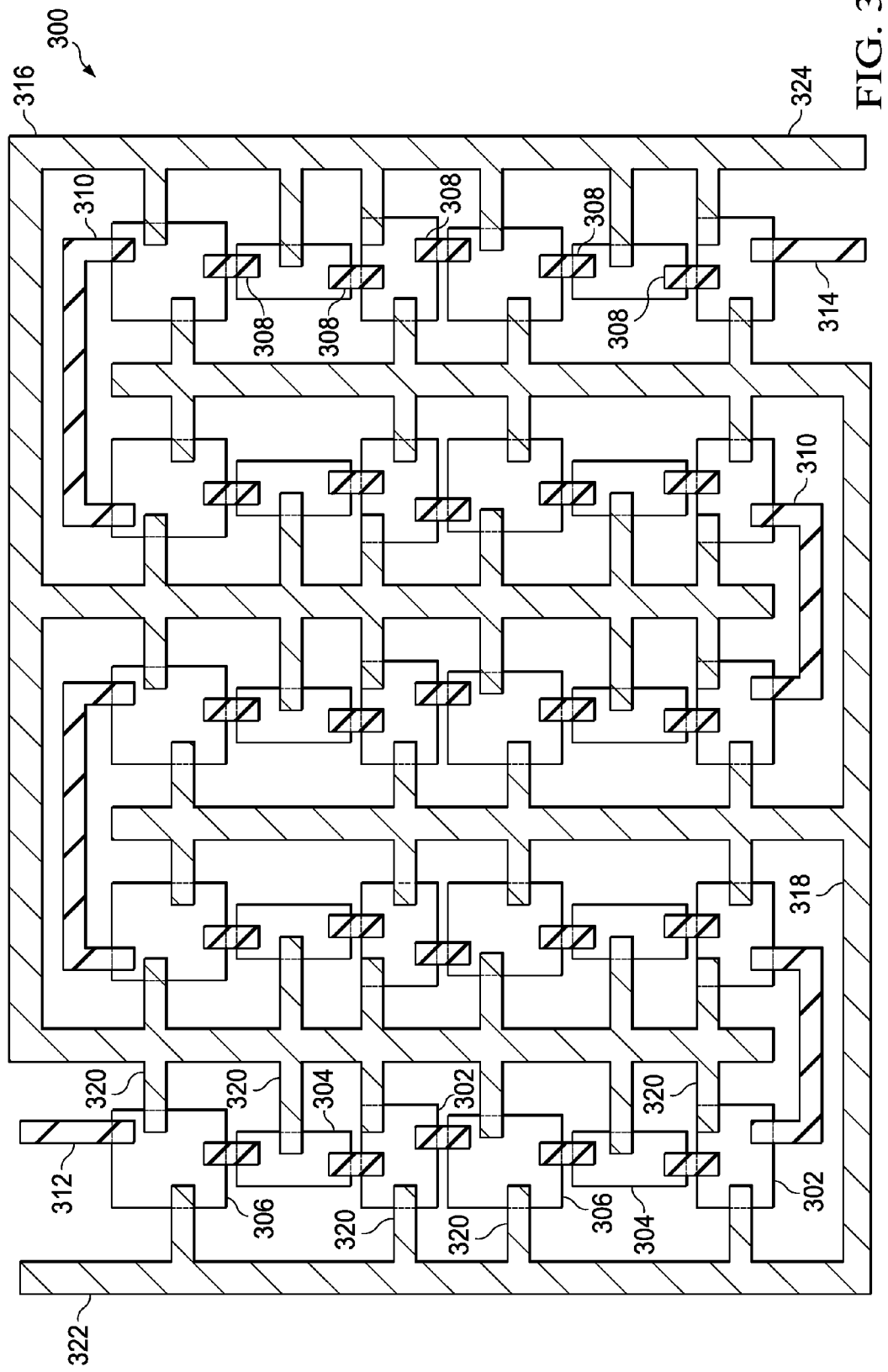
FIG. 3 is a plan view of an interconnect test circuit embodying the instant invention with multiple types of cells.

FIG. 3 is a plan view of an interconnect test circuit embodying the instant invention with multiple types of cells. Test circuit 300 includes a plurality of instances of three types of circuit blocks, a first type 302, a second type 304, and a third type 306. In each circuit block is a continuity path; continuity paths are connected in a serial manner by continuity interconnect links 308 and serpentine interconnect links 310 to form a continuity chain. Measuring electrical resistance from one end 312 of the continuity chain to another end 314 provides an assessment of open circuit defect levels that can be expected to occur in circuit blocks 302, 304, 306 as implemented in a commercial IC.

Still referring to FIG. 3, each type of circuit block 302, 304, 306 may include isolation features, as described above. Conductors adjacent to isolation features are electrically connected to top parallel isolation bus conductor 316 or bottom parallel isolation bus conductor 318 by links 320. Top parallel isolation bus conductor 316, bottom parallel isolation bus conductor 318 and the continuity chain are configured to form a parallel test circuit for isolation features, including, but not limited to a comb-serpent configuration, in which top parallel isolation bus conductor 316 and bottom parallel isolation bus conductor 318 are configured as interleaved combs, and the continuity chain is arranged between teeth of each comb in a serpentine configuration. Measuring electrical isolation from either end 312, 314 of the continuity chain to an end terminal 322 of bottom parallel isolation bus conductor 318 and to an end terminal 324 of top parallel isolation bus conductor 316 provides an assessment of short circuit defect levels that can be expected to occur in circuit blocks 302, 304, 306 as implemented in a commercial IC.

It will be recognized by practitioners of IC fabrication that fewer or more than three types of circuit blocks can be implemented in this embodiment. Combining circuit blocks in test circuits is advantageous because it enables assessments of defect levels for a plurality of circuit blocks with minimal testing.

Figure 4:
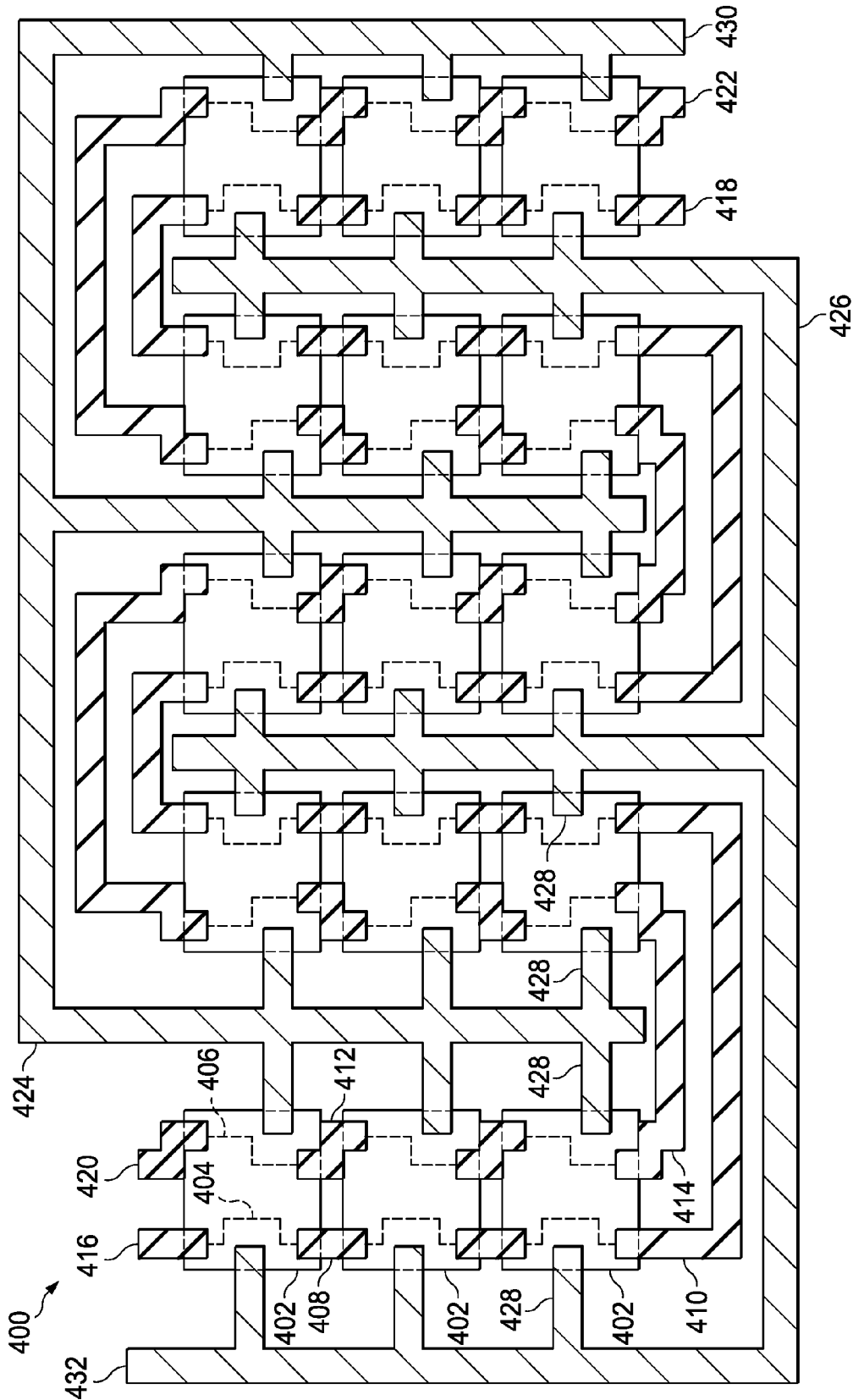
FIG. 4 is a plan view of an interconnect test circuit embodying the instant invention with multiple continuity paths.

FIG. 4 is a plan view of an interconnect test circuit embodying the instant invention with multiple continuity paths. A test circuit 400 includes a circuit block 402 of interest from commercial ICs. Circuit block 402 is reproduced multiple times in test circuit 400 for the purpose of defect level assessment. In circuit block 402 are a first continuity path 404, a second continuity path 406, and possibly more continuity paths. Each continuity path is electrically isolated from all other continuity paths in the circuit block 400. A purpose of test circuit 400 is to assess a level of defects that cause open circuits in each continuity path 404, 406. Instances of the first continuity path 404 are connected in a serial manner by a first continuity interconnect link 408 and a first serpentine interconnect link 410, forming a first continuity chain. In a similar manner, instances of the second continuity path 406 are connected in a serial manner by a second continuity interconnect link 412 and a second serpentine interconnect link 414, forming a second continuity chain. Additional continuity paths may be connected in series as described above to form additional continuity chains. Measuring electrical resistance from one end 416 of the first continuity chain to another end 418 of the same chain provides an assessment of open circuit defect levels in the first continuity path that can be expected to occur in circuit blocks 402 as implemented in a commercial IC. Similarly, measuring electrical resistance from one end 420 of the second continuity chain to another end 422 of the same chain provides an assessment of open circuit defect levels in the second continuity path that can be expected to occur in circuit blocks 402 as implemented in a commercial IC. Additional continuity chains, referred to above, may be tested in a similar manner to provide assessments of open circuit defect levels in the corresponding additional continuity paths.

Still referring to FIG. 4, circuit block 402 may include isolation features, as described above. Conductors adjacent to isolation features are electrically connected to top parallel isolation bus conductor 424 or bottom parallel isolation bus conductor 426 by links 428. Top parallel isolation bus conductor 424, bottom parallel isolation bus conductor 426 and the continuity chains are configured to form a parallel test circuit for isolation features. Measuring electrical isolation from either end 416, 418 of the first continuity chain, and from either end 420, 422 of the second continuity chain, to an end terminal 430 of top parallel isolation bus conductor 424 and to an end terminal 432 of bottom parallel isolation bus conductor 426 provides an assessment of short circuit defect levels that can be expected to occur in circuit blocks 402 as implemented in a commercial IC.

It will be recognized by practitioners of IC fabrication that more than two types of continuity paths can be implemented in this embodiment. Configuring more than one continuity chain in a test circuit is advantageous because it enables assessments of defect levels for a plurality of continuity paths with minimal testing and more efficient utilization of test circuit space.

Figure 5:
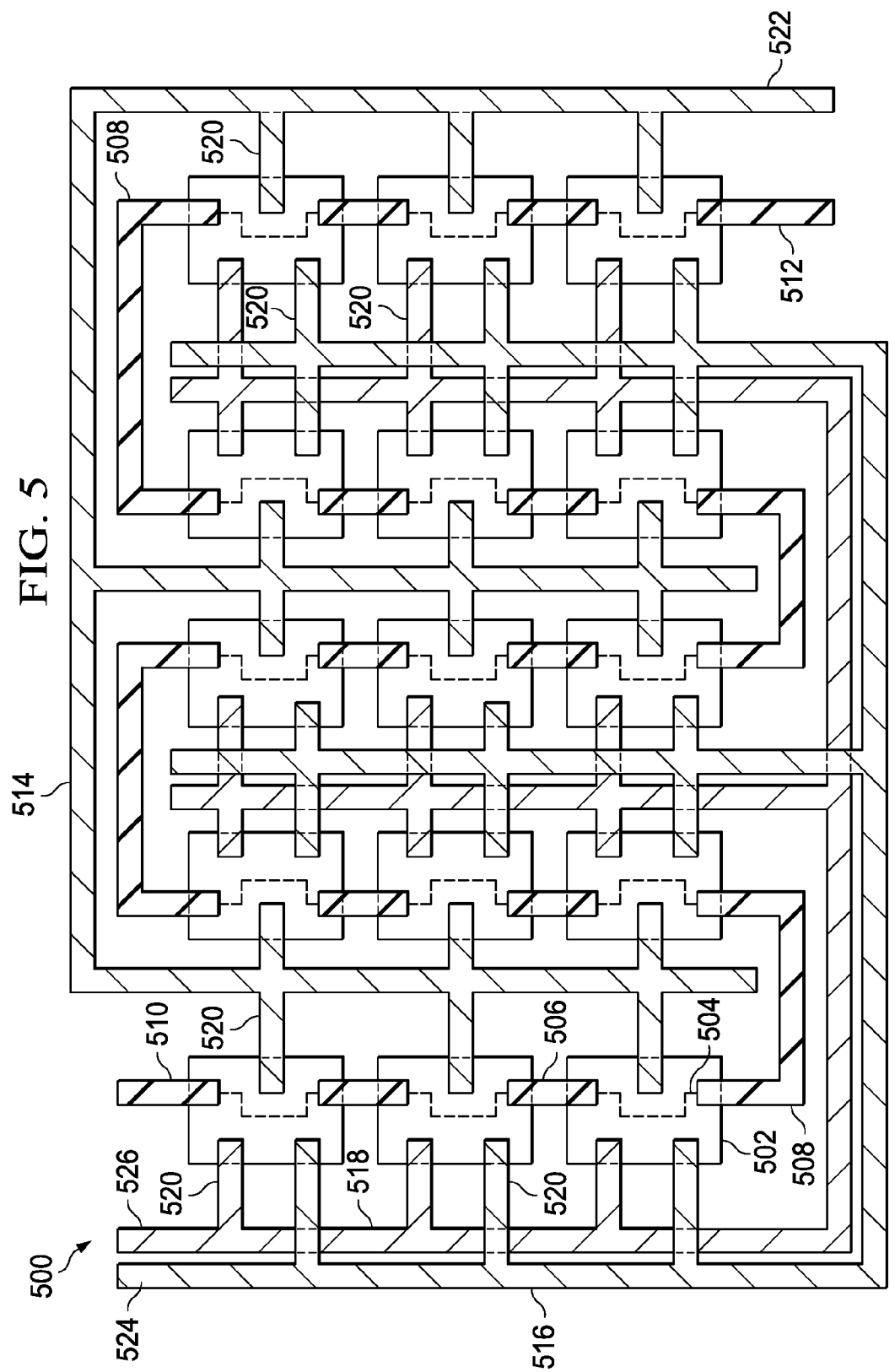
FIG. 5 is a plan view of an interconnect test circuit embodying the instant invention with multiple combs.

FIG. 5 is a plan view of an interconnect test circuit embodying the instant invention with multiple combs. A test circuit 500 includes a circuit block 502 of interest from commercial ICs. Circuit block 502 is reproduced multiple times in test circuit 500 for the purpose of defect level assessment. In circuit block 502 is a continuity path 504. Instances of the continuity path 504 are connected in a serial manner by a continuity interconnect link 506 and a serpentine interconnect link 508, forming a continuity chain. As in previous embodiments, measuring electrical resistance from one end 510 of the first continuity chain to another end 512 of the same chain provides an assessment of open circuit defect levels in the first continuity path that can be expected to occur in circuit blocks 502 as implemented in a commercial IC.

Still referring to FIG. 5, circuit block 502 includes isolation features, as described above. In this embodiment, more than two parallel isolation bus conductors are included. Conductors adjacent to isolation features are electrically connected to top parallel isolation bus conductor 514 or a first bottom parallel isolation bus conductor 516 or a second bottom parallel isolation bus conductor 518 by interconnect links 520. Top parallel isolation bus conductor 514, bottom parallel isolation bus conductors 516, 518 and said continuity chain are configured to form a parallel test circuit for isolation features. Measuring electrical isolation from either end 510, 512 of said continuity chain to an end terminal 522 of top parallel isolation bus conductor 514, to an end terminal 524 of first bottom parallel isolation bus conductor 516 and to an end terminal 526 of second bottom parallel isolation bus conductor 518 provides an assessment of short circuit defect levels that can be expected to occur in circuit blocks 502 as implemented in a commercial IC.

It will be recognized by practitioners of IC fabrication that more than two parallel isolation bus conductors can be implemented in this embodiment. Configuring more than two parallel isolation bus conductors in a test circuit is advantageous because it enables assessments of defect levels for a plurality of isolation features with minimal testing and more efficient utilization of test circuit space.

FIGS. 6A through 6D are views of an interconnect test circuit embodying the instant invention showing high level metal connections to combs, before and after removal of the high level metal. Any of the embodiments discussed above may be improved by configuring the links connecting conductors adjacent to isolation features to parallel isolation bus conductors on a metal level higher than any metal levels of interest in circuit blocks and higher than said links connecting continuity paths. Equivalent elements in FIGS. 6A through 6D are assigned the same reference numbers, to assist reading the disclosure.

Figure 6A:
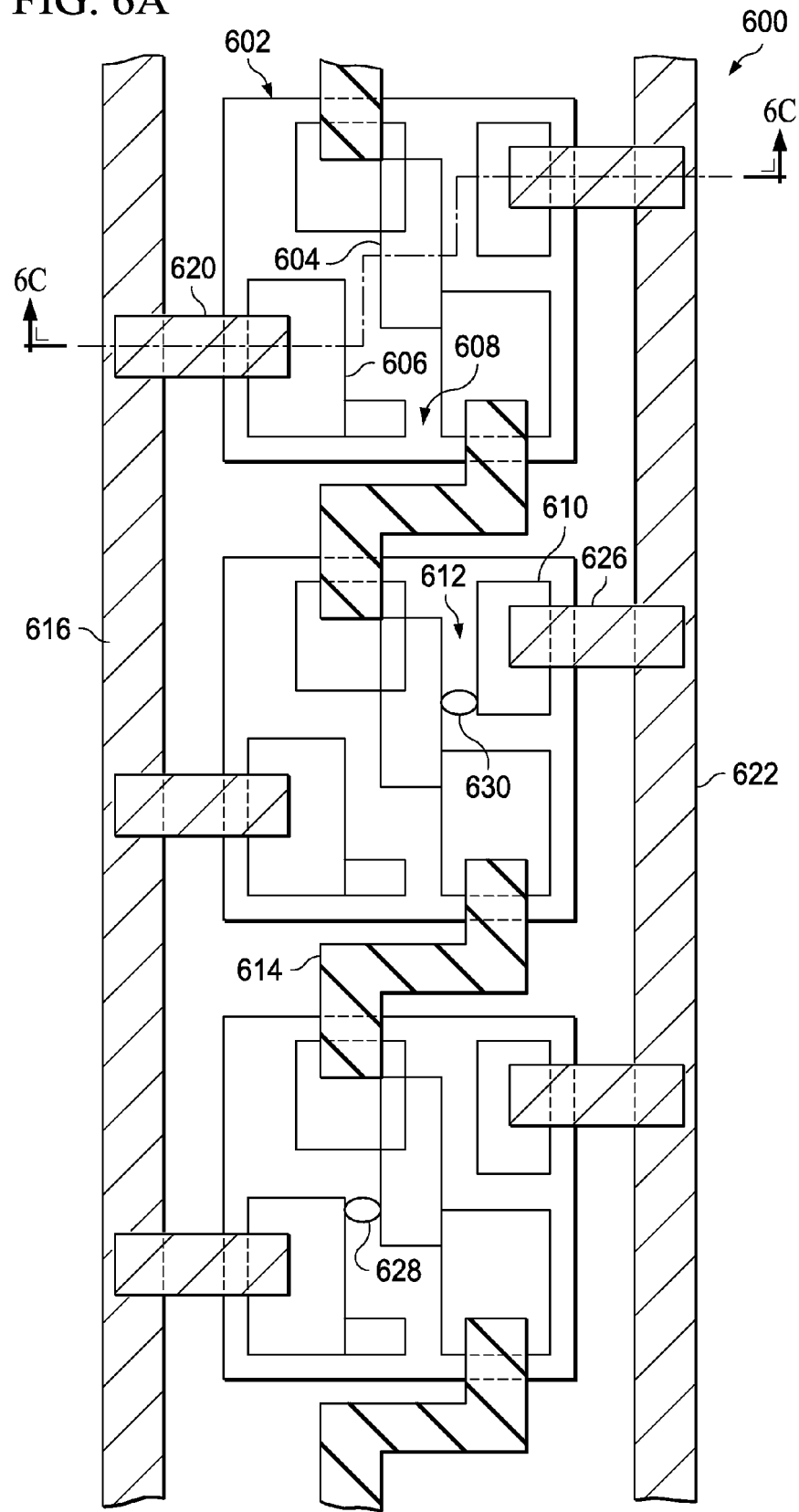

FIG. 6A and FIG. 6B are plan views of an interconnect test circuit embodying the instant invention showing high level metal connections to combs, before and after removal of said high level metal, respectively. Test circuit 600 includes multiple placements of a circuit block 602. In each circuit block 602 is a continuity path 604, a first conductor 606 adjacent to a first isolation feature 608 and a second conductor 610 adjacent to a second isolation feature 612. Instances of continuity path 604 are connected in a serial manner by continuity interconnect links 614 to form a continuity chain. First conductor 606 adjacent to first isolation feature 608 is connected to a first parallel isolation bus conductor 616 by a first intermediate link 618 and a first top link 620, whereby first top link 620 is on a metal level higher than any features of interest in circuit block 602 and higher than continuity chain link 614. Similarly, second conductor 610 adjacent to second isolation feature 612 is connected to a second parallel isolation bus conductor 622 by a second intermediate link 624 and a second top link 626, whereby second top link 626 is on a metal level higher than any features of interest in circuit block 602 and higher than continuity chain link 614. A first short circuit defect 628 electrically connects one instance of first conductor 606 adjacent to an instance of first isolation feature 608 to one instance of continuity path 604. Similarly, a second short circuit defect 630 electrically connects one instance of second conductor 610 adjacent to an instance of second isolation feature 612 to one instance of continuity path 604. First and second short circuit defects 628, 630 are detectable by measuring electrical isolation between said continuity chain and first and second parallel isolation bus conductors 616, 622, in the circuit configuration depicted in FIG. 6A. It is difficult to locate short circuit defects among the multitude of potential failure sites in a test circuit as depicted in FIG. 6A, wherein all conductors adjacent to isolation features are connected to parallel isolation bus conductors. Removing connections between conductors adjacent to isolation features and parallel isolation bus conductors, as depicted in FIG. 6B, allows users to locate short circuit defects using a voltage contrast analysis in a scanning electron microscope. The removal of connections between conductors adjacent to isolation features and parallel isolation bus conductors may be accomplished by several techniques. One technique is to remove successive layers of said test circuit, starting with the top layer, until said connections between conductors adjacent to isolation features and parallel isolation bus conductors are severed, and metal layers with features of interest in said circuit blocks and said continuity interconnect links remain undisturbed.

Figure 6C:
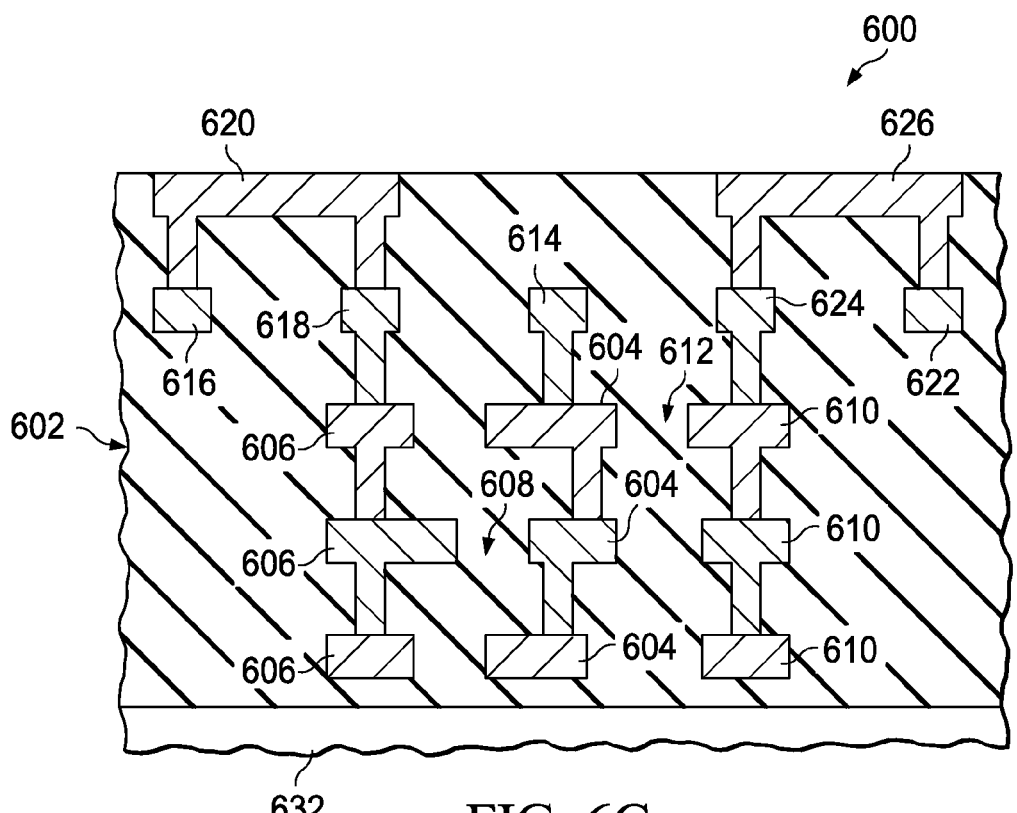
FIGS. 6C and 6D are section views taken along the lines 6C-6C and 6D-6D of FIGS. 6A and 6B, respectively.
Figure 6D:
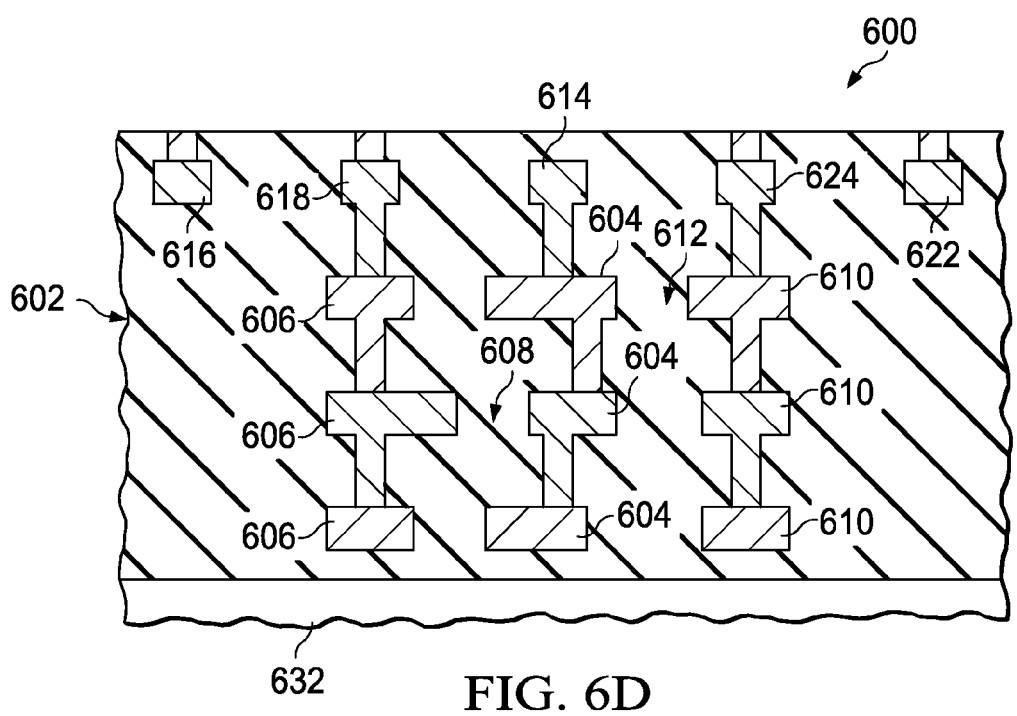

FIG. 6C and FIG. 6D depict cross-sections of a portion of said test circuit embodying the instant invention showing high level metal connections to combs, before and after removal of said high level metal, respectively. Referring to FIG. 6C, a test circuit 600 includes a substrate 632, a continuity path 604 of the type discussed above, a first conductor 606 adjacent to a first isolation feature 608, as discussed above, and a second conductor 610 adjacent to a second isolation feature 612. As in previous embodiments, conductors adjacent to isolation features are electrically isolated from continuity paths, unless connected by a defect. Continuity path 604 is connected to similar continuity paths in other placements of circuit block 602 by interconnect link 614 to form a continuity chain, as discussed above. First conductor 606 adjacent to first isolation feature 608 is connected to a parallel isolation bus conductor 616 by an intermediate link 618 and a first top link 620, whereby first top link 620 is on a metal level higher than any features of interest in circuit block 602 and higher than continuity chain link 614. Similarly, second conductor 610 adjacent to second isolation feature 612 is connected to a parallel isolation bus conductor 622 by an intermediate link 624 and a second top link 626, whereby second link 626 is on a metal level higher than any features of interest in circuit block 602 and higher than continuity chain link 614.

FIG. 6D depicts the test circuit discussed above in reference to FIG. 6C, wherein the test circuit has been partially deprocessed to remove the metal level containing first and second top links 620, 626 between conductors adjacent to isolation structures and parallel isolation bus conductors, and leave intact metal levels containing all features of interest in circuit block 602 and continuity path links 614. After said deprocessing, instances of conductors 606, 610 which are electrically connected to said continuity chain by defects, as discussed above, are easily located by a voltage contrast analysis in a scanning electron microscope, a known technique to practitioners of IC fabrication. Thus, the instant embodiment of configuring said links connecting conductors adjacent to isolation features to parallel isolation bus conductors on a metal level higher than any metal levels of interest in said circuit blocks and higher than said links connecting continuity paths is advantageous in that it enables users of said test circuit to easily locate defects causing short circuit failures in isolation features.

Practitioners of IC fabrication will recognize that the benefits of the above embodiment are realized if the parallel isolation bus conductors are located on the same metal level as the top links and are removed by deprocessing as described above.

Practitioners of IC fabrication will also recognize the same benefit of locating short circuit defects will be realized on partially fabricated test circuits, which have fabricated interconnect levels up to, but not including, any level containing said top links.

FIGS. 7A through 7D are views of an interconnect test circuit embodying the instant invention with parallel isolation bus conductors that are segmented on a lower level or levels and contiguous on a top level, before and after removal of the high level metal. This embodiment realizes the same benefits of locating short circuit defects as the embodiment discussed in reference to FIGS. 6A through 6D. Equivalent elements in FIGS. 7A through 7D are assigned the same reference numbers, to assist reading the disclosure.

Figure 7A:
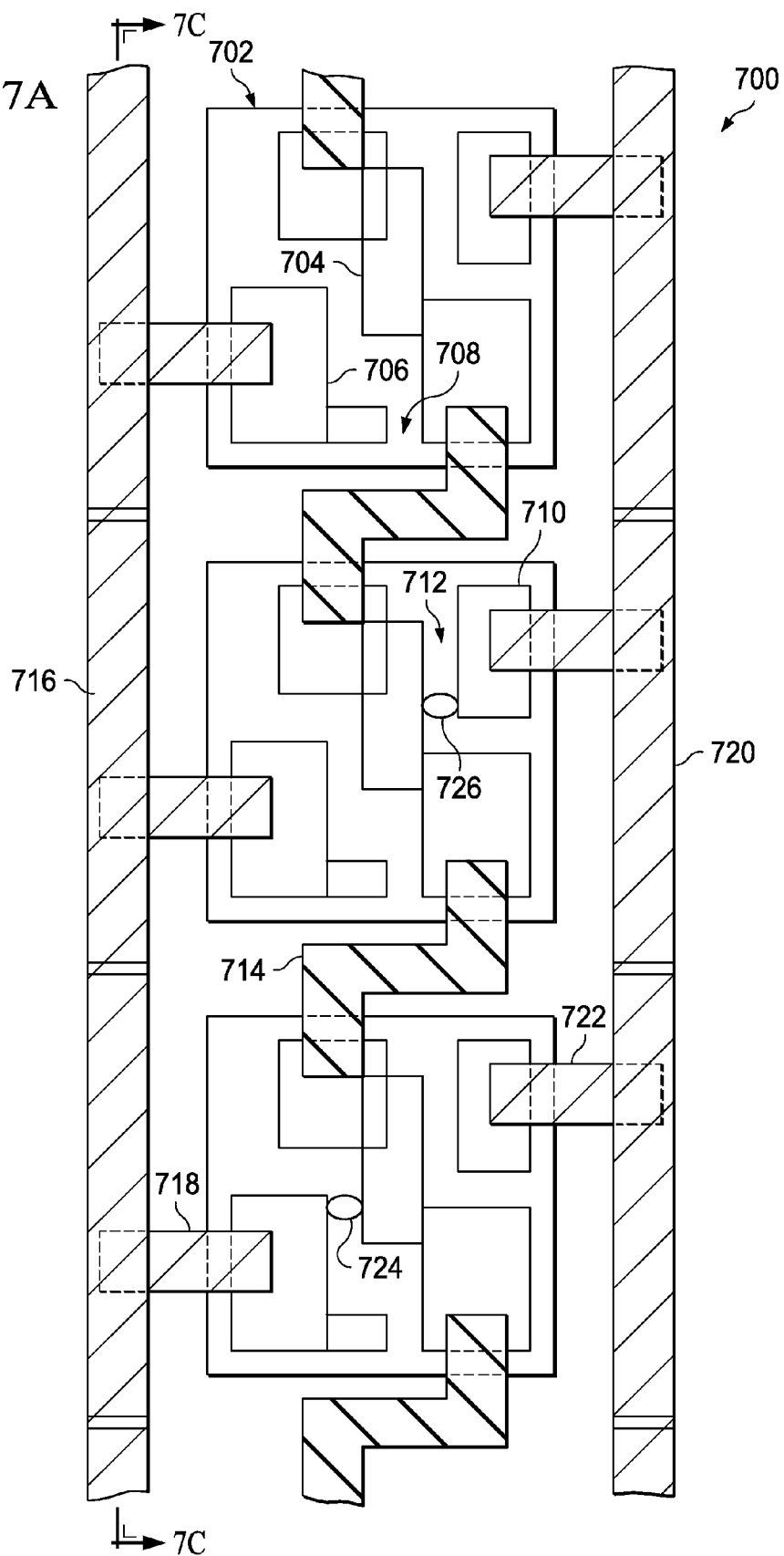

FIGS. 7A and 7B are plan views of an interconnect test circuit embodying the instant invention with parallel isolation bus conductors that are segmented on a lower level or levels, and contiguous on a top level, before and after removal of said top level metal, respectively. Test circuit 700 includes multiple placements of a circuit block 702. In each circuit block 702 is a continuity path 704, a first conductor 706 adjacent to a first isolation feature 708 and a second conductor 710 adjacent to a second isolation feature 712. Instances of continuity path 704 are connected in a serial manner by continuity interconnect links 714 to form a continuity chain. First conductor 706 adjacent to first isolation feature 708 is connected to a first parallel isolation bus conductor 716 by a first parallel isolation link 718 which is on an interconnect level lower than the first parallel isolation bus conductor 716. Similarly, second conductor 710 adjacent to second isolation feature 712 is connected to a second parallel isolation bus conductor 720 by a second parallel isolation link 722 which is on an interconnect level lower than the first parallel isolation bus conductor 720. A first short circuit defect 724 electrically connects one instance of first conductor 706 adjacent to an instance of first isolation feature 708 to one instance of continuity path 704. Similarly, a second short circuit defect 726 electrically connects one instance of second conductor 710 adjacent to an instance of second isolation feature 712 to one instance of continuity path 704. First and second short circuit defects 724, 726 are detectable by measuring electrical isolation between said continuity chain and first and second parallel isolation bus conductors 716, 720, in the circuit configuration depicted in FIG. 7A. It is difficult to locate short circuit defects among the multitude of potential failure sites in a test circuit as depicted in FIG. 7A, wherein all conductors adjacent to isolation features are connected to parallel isolation bus conductors. Severing connections between conductors adjacent to isolation features and parallel isolation bus conductors, as depicted in FIG. 7B, allows users to locate short circuit defects using a voltage contrast analysis in a scanning electron microscope. The severing of connections between conductors adjacent to isolation features and parallel isolation bus conductors is accomplished by removing a top level of parallel isolation bus conductors 716, 720, leaving first and second parallel isolation bus segments 728, 730. A procedure for said removal is to remove successive layers of said test circuit, known as deprocessing, starting with the top layer, until said top level of parallel isolation bus conductors 716, 720 are removed, and metal layers with features of interest in said circuit blocks and said first and second parallel isolation bus segments 728, 730 remain undisturbed.

Figure 7C:
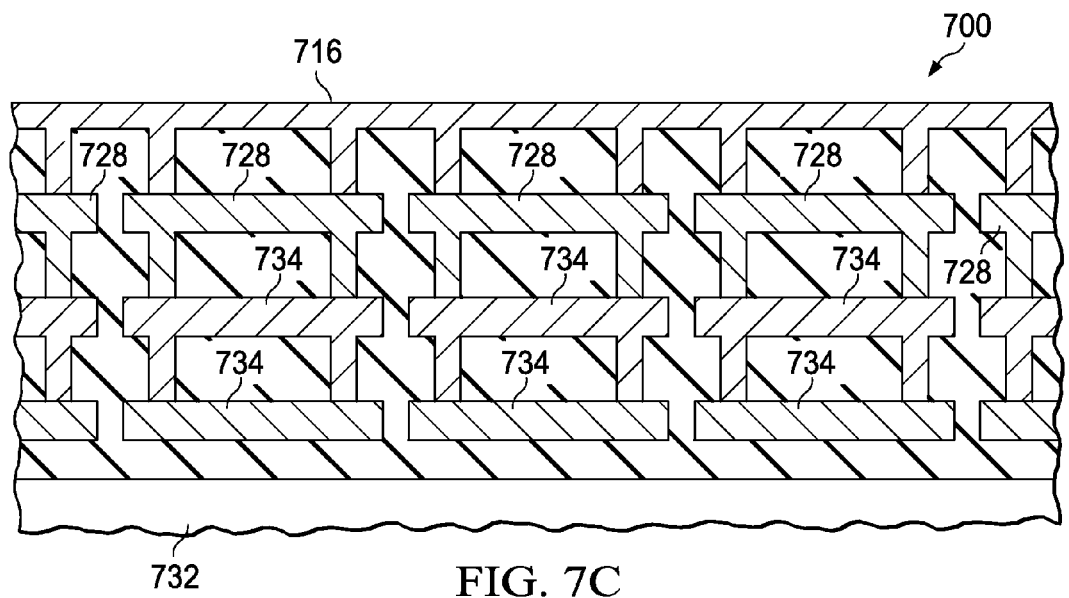
FIGS. 7C and 7D are section views taken along the lines 7C-7C and 7D-7D of FIGS. 7A and 7B, respectively.
Figure 7D:
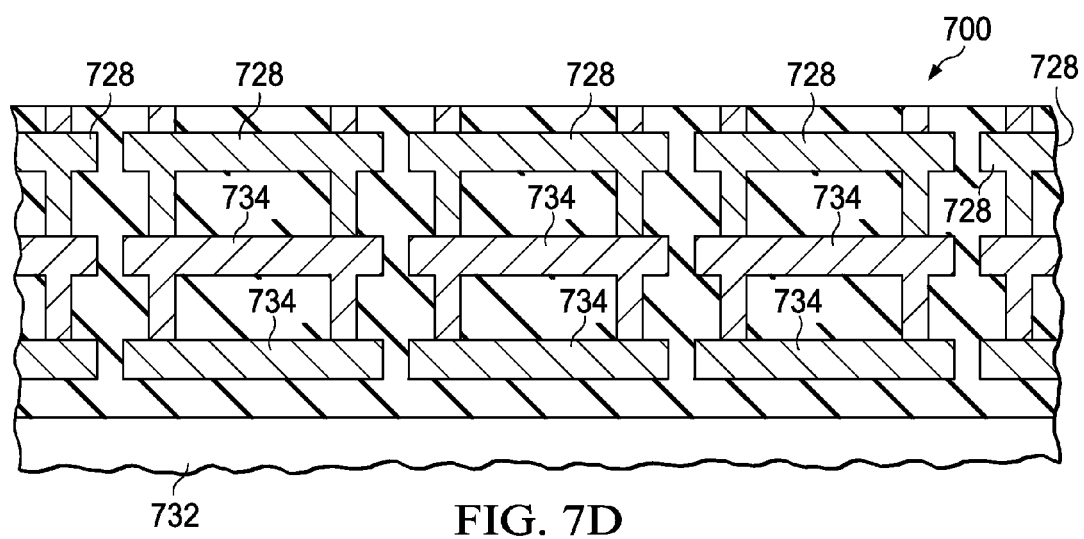

FIGS. 7C and 7D depict cross-sections of a portion of said test circuit embodying the instant invention with parallel isolation bus conductors that are segmented on a lower level or levels, and contiguous on a top level, before and after removal of said top level metal, respectively. Referring to FIG. 7C, a test circuit 700 includes a substrate 732, parallel isolation bus conductor 716, and parallel isolation bus segments 728 which may include elements at lower interconnect levels 734, whereby parallel isolation bus conductor 716 is on a metal level higher than any features of interest in said circuit block and higher than said continuity chain link, and said parallel isolation links are on a same interconnect level as parallel isolation bus segments 728.

FIG. 7D depicts the test circuit discussed above in reference to FIG. 7C, wherein the test circuit has been partially deprocessed to remove the metal level containing parallel isolation bus conductor 716, leaving intact metal levels containing parallel isolation bus segments 728 and segment elements at lower interconnect levels 734. After said deprocessing, instances of conductors which are electrically connected to said continuity chain by defects, as discussed above, as easily located by a voltage contrast analysis in a scanning electron microscope, a known technique to practitioners of IC fabrication. Thus, the instant embodiment of configuring said parallel isolation buses as contiguous conductors on a metal level higher than any metal levels of interest in said circuit blocks and higher than said links connecting continuity paths, and segmented conductors on lower interconnect levels connected to conductors adjacent to isolation features is advantageous in that it enables users of said test circuit to easily locate defects causing short circuit failures in isolation features. This embodiment is similar to that discussed in reference to FIGS. 6A through 6D, with the comparative advantage that shorted small conductors adjacent to isolation features are easier to identify by virtue of the larger conductor segment to which they remain connected.

Practitioners of interconnect fabrication will also recognize the same benefit of locating short circuit defects will be realized on partially fabricated test circuits, which have fabricated interconnect levels up to, but not including, any level containing said parallel isolation bus conductor 716.

The test circuit may be included in an integrated circuit having a plurality of components formed in a substrate and a plurality of interconnects connected to the components. Such integrated circuit may, for example, include field oxide regions, n-wells, and p-wells in the substrate. N-channel MOS transistors in a p-well may each include a first gate dielectric on a top surface of the p-well, a first gate structure on a top surface of the first gate dielectric, n-type source and drain regions in the p-well adjacent to the first gate structure, and a first set of silicide regions on, and in contact with, top surfaces of the n-type source and drain regions. P-channel MOS transistors in an n-well may each include a second gate dielectric on a top surface of the n-well, a second gate structure on a top surface of the second gate dielectric, p-type source and drain regions in the n-well adjacent to the second gate structure, and a second set of silicide regions on, and in contact with, top surfaces of the p-type source and drain regions. Also included may be a pre-metal dielectric layer stack on the n-channel transistors and the p-channel transistors; contacts in the pre-metal dielectric layer stack on, and electrically connected to, the n-type source and drain regions and the p-type source and drain regions; a first intra-metal dielectric layer on the pre-metal dielectric layer stack; a first set of metal interconnect structures in the first intra-metal dielectric layer; a first inter-level dielectric layer on the first set of metal interconnect structures; a first set of metal vias in the first inter-level dielectric layer, whereby metal vias in the first set of metal vias contact metal interconnect structures in the first set of metal interconnect structures; and a second set of metal interconnect structures in the first inter-level dielectric layer, whereby metal interconnect structures in the second set of metal interconnect structures contact and overlap metal vias in the first set of metal vias.

Providing an assessment of the open circuit defect levels through measurement of electrical resistance of the continuity test chain may, for example, be done as follows: recording a number of times the step of measuring a first electrical resistance was executed; counting a number of instances of the first electrical resistance measurement which exceed a threshold value; and assigning a defect level value to the number of instances that the first electrical resistance measurement exceeds the threshold value divided by a product of the number of times the first electrical resistance measurement was executed, times an area of the test circuit. A similar procedure may be followed for a second continuity test chain: measuring a second electrical resistance of instances of the second continuity test chain; recording the number of times the step of measuring the second electrical resistance was executed; counting the number of instances of the second electrical resistance measurement which exceed a second threshold value; and assigning a second defect level value to the number of instances that the second electrical resistance measurement which exceed the second threshold value divided by a product of the number of times the second electrical resistance measurement was executed, times an area of the test circuit.

Assessment of the short circuit defect levels may be done providing a parallel conductive element adjacent to the plurality of instances of the circuit block to form an isolation test structure: measuring a third electrical resistance of instances of the isolation test structure; recording the number of times the step of measuring the third electrical resistance was executed; counting the number of instances of the third electrical resistance measurement which are below a third threshold value; and assigning a third defect level value to the number of instances of the third electrical resistance measurement which are below the third threshold value divided by a product of the number of times the third electrical resistance measurement was executed, times an area of the test circuit. A similar procedure may be followed also for a second parallel conductive element provided adjacent to the plurality of instances of the circuit block to form a second isolation test structure: measuring a fourth electrical resistance of instances of the second isolation test structure; recording the number of times the step of measuring the fourth electrical resistance was executed; counting the number of instances of the fourth electrical resistance measurement which are below a fourth threshold value; and assigning a fourth defect level value to the number of instances of the fourth electrical resistance measurement which are below the fourth threshold value divided by a product of the number of times the fourth electrical resistance measurement was executed, times an area of the test circuit.

What is claimed is:

1. An integrated circuit including functional circuit blocks having circuit components fabricated in surface layers of a semiconductor substrate and metal interconnects fabricated in layers above the substrate, and testing circuitry for testing the functional circuit blocks; the testing circuitry comprising:
   the functional circuit blocks being provided in modified form with respective continuity paths of conductive elements having first elements and last elements, such that passing electrical current from the first element to the last element will result in current flowing through every element in the continuity path; and also including respective isolation features which separate the conductive elements of the interconnects; and
   a test structure having:
      test circuit blocks comprising sets of multiple duplicate instances of the modified functional circuit blocks including duplications of the continuity paths and isolation features;
      continuity interconnect links and serpentine interconnect links connecting the duplicated continuity paths of the respective duplicated blocks in a serial manner with the last element of the continuity path of one duplicated block being connected to a first element of the continuity path of a next duplicated block, thereby forming a continuity chain of the individual continuity paths of the duplicated blocks;

a first parallel isolation bus conductor electrically connected to first conductive elements on first sides of the duplicated isolation features; and a second parallel isolation bus conductor electrically connected to second conductive elements on second sides of the duplicated isolation features, electrically isolated from the first conductive elements; the first and second parallel isolation buses defining a parallel isolation test circuit for the isolation features.

2. The integrated circuit of claim 1, wherein the second parallel isolation bus conductor is provided in at least a portion of the continuity chain.

3. The integrated circuit of claim 2,
wherein the modified functional circuit blocks are provided further including respective second isolation features which separate the conductive elements of the interconnects;
wherein the test circuit blocks are provided further including duplications of the second isolation features;
wherein the second parallel isolation bus conductor is provided electrically connected to third conductive elements on one or first or second sides of the duplicated second isolation features; and
wherein the test structure is provided further including a third parallel isolation bus conductor electrically connected to fourth conductive elements on the other of first or second sides of the duplicated second isolation features; the second and third parallel isolation buses defining a second parallel isolation test circuit for the second isolation features.

4. The integrated circuit of claim 1, wherein the test structure is provided further including interconnect links formed between the first or second conductive elements and the first or second parallel isolation bus conductor formed on a highest metal level.

5. The integrated circuit of claim 1,
wherein the functional circuit blocks are provided further including respective additional continuity paths;
wherein the test circuit blocks are provided further including duplications of the additional continuity paths; and
wherein the test structure is provided further including additional continuity interconnect links and additional serpentine interconnect links connecting the duplicated additional continuity paths in a serial manner, thereby forming additional continuity chains of the individual additional continuity paths.

6. An integrated circuit including functional circuit blocks having circuit components fabricated in surface layers of a semiconductor substrate and metal interconnects fabricated in layers above the substrate and testing circuitry for testing the functional circuit blocks; the circuitry comprising:
the functional circuit blocks provided in modified form with respective continuity paths of conductive elements having first elements and last elements, such that passing electrical current from the first element to the last element will result in current flowing through every element in the continuity path; and also including respective isolation features which separate the conductive elements of the interconnects; and
a test structure having:
test circuit blocks comprising sets of multiple duplicate instances of the modified functional circuit blocks including duplications of the continuity paths and isolation features;
continuity interconnect links and serpentine interconnect links connecting the duplicated continuity paths of the respective duplicated blocks in a serial manner with the last element of the continuity path of one duplicated block being connected to a first element of the continuity path of a next duplicated block, thereby forming a continuity chain of the individual continuity paths of the duplicated blocks;
a first parallel isolation bus conductor electrically connected to first conductive elements on first sides of the duplicated isolation features; and
a second parallel isolation bus conductor electrically connected to second conductive elements on second sides of the duplicated isolation features, electrically isolated from the first conductive elements; the first and second parallel isolation buses defining a parallel isolation test circuit for the isolation features;
whereby measuring electrical resistance between ends of the continuity chain may provide an assessment of a level of open circuit defects that can be expected to occur in the functional circuit blocks in the integrated circuit; and
whereby measuring electrical isolation between terminals of the first parallel isolation bus conductor and the second parallel isolation bus conductor may provide an assessment of a level of short circuit defects that can be expected to occur in the functional circuit blocks in the integrated circuit.

7. The integrated circuit of claim 6,
wherein the second parallel isolation bus conductor is provided in at least a portion of the continuity chain; and
whereby measuring the electrical isolation including measuring electrical isolation between either end of the continuity chain and the terminal of the first parallel isolation bus conductor may provide the assessment of the level of short circuit defects.

8. The integrated circuit of claim 7,
wherein the modified functional circuit blocks are provided further including respective second isolation features which separate the conductive elements of the interconnects;
wherein the test circuit blocks are provided further including duplications of the second isolation features;
wherein the second parallel isolation bus conductor is provided electrically connected to third conductive elements on one or first or second sides of the duplicated second isolation features;
wherein the test structure is provided further including a third parallel isolation bus conductor electrically connected to fourth conductive elements on the other of first or second sides of the duplicated second isolation features; the second and third parallel isolation buses defining a second parallel isolation test circuit for the second isolation features;
whereby measuring the electrical isolation between either end of the continuity chain and the terminal of the first parallel isolation bus conductor may provide the assessment of the level of short circuit defects that can be expected to occur in the functional circuit blocks for the first isolation features; and
whereby measuring the electrical isolation including measuring the electrical isolation between either end of the continuity chain and a terminal of the third parallel isolation bus conductor may provide an assessment of the level of short circuit defects that can be expected to occur in the functional circuit blocks for the second isolation features.

9. The integrated circuit of claim 6,
wherein the test structure is provided further including interconnect links formed between the first or second conductive elements and the first or second parallel isolation bus conductor formed on a highest metal level; and
whereby using voltage contrast analysis may identify test circuit blocks with short circuit defects among the placements of all the test circuit blocks.

10. The integrated circuit of claim 6,
wherein the functional circuit blocks are provided further including respective additional continuity paths;
wherein the test circuit blocks are provided further including duplications of the additional continuity paths; and
wherein the test structure is provided further including additional continuity interconnect links and additional serpentine interconnect links connecting the duplicated additional continuity paths in a serial manner, thereby forming additional continuity chains of the individual additional continuity paths;
whereby measuring the electrical resistance including measuring the electrical resistance between ends of the additional continuity chains may provide an assessment of a level of open circuit defects that can be expected to occur in the functional circuit blocks for the additional continuity paths.

* * * * *